(12) United States Patent
Cuignet et al.

(10) Patent No.: US 8,674,759 B2
(45) Date of Patent: Mar. 18, 2014

(54) POWER MANAGEMENT SYSTEM FOR DUAL TRAVELLING WAVE TUBE AMPLIFIER

(75) Inventors: Etienne Cuignet, Saint-Ghislain (BE); Denis Andrin, La Hestre (BE); Emile Tonello, Saint-Lys (FR)

(73) Assignee: Thales, Neuilly sur Seine (FR)

( * ) Notice: Subject to any disclaimer, the term of this patent is extended or adjusted under 35 U.S.C. 154(b) by 120 days.

(21) Appl. No.: 13/278,069

(22) Filed: Oct. 20, 2011

(65) Prior Publication Data

US 2012/0268203 A1 Oct. 25, 2012

(30) Foreign Application Priority Data

Oct. 22, 2010 (EP) ..................................... 10290572

(51) Int. Cl.
*H03G 3/20* (2006.01)
(52) U.S. Cl.
USPC ............................................ 330/127; 330/43
(58) Field of Classification Search
USPC ................ 330/43–45, 127, 129, 297
See application file for complete search history.

(56) References Cited

U.S. PATENT DOCUMENTS

| | | | |
|---|---|---|---|
| 4,687,970 A | 8/1987 | Musslyn et al. | |
| 6,229,262 B1 | 5/2001 | Hulsey et al. | |
| 7,358,803 B2 * | 4/2008 | Goldberg et al. | 330/43 |
| 8,212,481 B2 * | 7/2012 | Nakazato | 330/43 |
| 2005/0057159 A1 | 3/2005 | Abiko et al. | |
| 2006/0103460 A1 * | 5/2006 | Eng | 330/43 |
| 2011/0316622 A1 * | 12/2011 | Hara | 330/127 |

FOREIGN PATENT DOCUMENTS

WO 2006065388 A1 6/2006

\* cited by examiner

*Primary Examiner* — Khanh V Nguyen
(74) *Attorney, Agent, or Firm* — Baker & Hostetler LLP

(57) ABSTRACT

A power management system, notably for a dual travelling wave tube amplifier, includes: two travelling wave tubes, each comprising one Anode Zero electrode, and an electronic power conditioner, the power management system being implemented in said electronic power conditioner and including power management means associated with each travelling wave tube, configured for setting the Anode Zero electrode voltage to a determined minimum value when a sleep mode is activated, the power management means maintaining the travelling wave tube operating power at a value below its nominal working range. A sleep mode can advantageously be combined with an RF-Mute mode.

8 Claims, 3 Drawing Sheets

POWER MANAGEMENT SYSTEM FOR DUAL TRAVELLING WAVE TUBE AMPLIFIER

CROSS-REFERENCE TO RELATED APPLICATION

This application claims priority to foreign European patent application No. EP 10290572.6, filed on Oct. 22, 2010, the disclosure of which is incorporated by reference in its entirety.

FIELD OF THE INVENTION

The current invention relates to a power management system for a dual travelling wave tube amplifier. It notably applies to telecommunication satellites.

BACKGROUND

Telecommunication satellites usually comprise a platform and a payload, the latter being comprising all equipments, notably all devices intended for generating and transmitting high power radiofrequency signals—hereinafter referred to as RF signals—toward the ground. Different known techniques are resorted to for transmitting high power RF signals.

A first technique is based on the solid state technology, and involves Solid State Power Amplifiers, usually referred to as SSPAs. SSPAs notably have the drawback of not being in a position to manage usually requested levels of RF power.

A second technique is based on the use of Travelling Wave Tube Amplifiers, hereinafter referred to as TWTAs. TWTAs notably comprise a Travelling Wave Tube, hereinafter referred to as TWT. Telecommunication satellite payloads nowadays extensively use TWTAs. TWTAs are particularly efficient devices for high power RF transmission channels, and allow for managing very high levels of transmitted RF power. TWTA relies on a tube-based technology which requests a very precise tuning, not only on the manufacturing level, but also as regard to the accuracy of electrical interfaces. A TWT is described in much detail below in reference to FIG. 1, and basically comprises an RF input and an RF output, a helix, and electrodes comprising a cathode emitting electrons forming an electron beam, an anode, usually referred to as "Anode Zero" or "Anode 0", focussing the electron beam, and a plurality of collectors. Usually, the cathode current is related to the Anode Zero voltage through a factor being usually referred to as "pushing factor". It shall be observed that Anode Zero voltage is hereinafter referred to as the electrical potential difference between the Anode Zero electrode and the cathode. It shall be understood though, that a person of ordinary skill in the art may equally be able to carry out the invention by considering the Anode Zero voltage in reference to the helix electrical potential, or any other reference potential.

A TWTA usually comprises a TWT, associated with an Electronic Power Conditioner, hereinafter referred to as EPC, whose purpose is to supply the TWT with requested electrical operational conditions and to transfer the requested level of power from the electrical source to the TWT. The EPC is usually a DC-DC power converter supplied in energy through a primary bus, and generating the voltage levels requested on each of the electrodes comprised in the TWT, with an accuracy level allowing to ensure the TWT performances, that is: its linearity, the efficiency and the stability of the power transfer.

More specifically, there exist known TWTAs referred to as LTWTAs, standing for Linearized TWTAs, which further comprise an additional linearized preamplifier aiming at conditioning the RF signal level with the RF input of the TWT, and providing compensation to spurious nonlinearity phenomena notably brought by the TWT.

Dual TWTAs are specific TWTAs, essentially consisting of two TWTs driven by one EPC. The TWTs can then be used simultaneously and independently, or RF combined in order to provide higher power output RF signals. Therefore, a dual TWTA can be considered as an assembly of the following sub-functions:

two TWTs aiming at transferring the DC power to RF signal through 2 independent channels, one EPC aiming at providing power supply and electrode polarization to both TWTs.

Likewise, there exist dual LTWTAs, which are comprising the sub-functions described above, as well as two Linearized preamplifiers aiming at conditioning the RF signal for the respective inputs of both TWTs, and to provide compensation to the linearity errors thereof.

One major drawback of Dual TWTAs lies on the turn-on management of the second TWT: indeed, in order to avoid any defocusing of the TWT electron beam, high voltages shall be applied only when a certain cathode temperature is reached. An EPC for a dual TWTA therefore usually comprises means for managing the pre-heating phase of the cathode. Thus, at turning on of the second TWT, the channel passing through the first TWT is interrupted for the time the second TWT cathode reaches its operational temperature, which can be of the order of a few minutes. This phenomenon therefore implies a traffic interruption, which is in conflict with the operator's requirements in terms of satellite's channel operability.

One existing solution aiming at palliating the afore-mentioned drawbacks can be implemented in LTWTAs, and basically consists in turning on the second TWT very early during the satellite's mission and to letting it in a "no drive" operating mode for all the time it shall not be actually used in operation. The "no drive" operating mode may also be referred to as "RF mute" mode, and is managed through the linearized preamplifiers. "RF mute" mode is essentially a mode wherein no RF signal is conducted through the TWT. This solution shall penalize the satellite's payload, notably caused by useless power dissipation and related thermal management constraints. Indeed, as the unused second TWT is operated in no-drive mode, while the first TWT is being operated, the second TWT nevertheless continues consuming DC power and dissipating heat.

One other existing solution essentially consists of using the Power Flexibility functionality of the EPC, which essentially consists of adapting the TWT power by setting its optimum operating point, or saturation point, through adjusting the cathode current. Such solution allows setting the output power command to its minimum that is: typically attenuating it by 3 dB. This also allows reducing power but not yet to the extent proposed by the object of current invention.

SUMMARY OF THE INVENTION

One aim of the current invention is to palliate at least the afore-mentioned drawbacks, by proposing a power management system for dual travelling wave tube amplifier or dual TWTA preventing any traffic interruption when operating independently the two TWTs, while not impacting significantly the global payload power consumption.

One further advantage of the current invention is that it can be implemented through costless and weightless device, thus not significantly impacting the satellite's payload.

One further advantage of the current invention is that it does not affect the durability of the TWTs.

For that purpose, the current invention proposes a power management system, notably for a dual travelling wave tube amplifier comprising at least two travelling wave tubes, each travelling wave tube comprising one Anode Zero electrode, and an electronic power conditioner, the power management system being implemented in said electronic power conditioner and characterized in that it comprises power management means associated with each travelling wave tube, configured for setting the Anode Zero electrode voltage to a determined minimum value when a sleep mode is activated, the power management means being maintaining the travelling wave tube operating power at a value below its nominal working range.

In an exemplary embodiment of the invention, the power management system following can further comprise a cathode current control loop driven by a cathode current setting means and a cathode current sensing means, the cathode current control loop being driving an Anode Zero driving module setting the Anode Zero voltage.

In an exemplary embodiment of the invention, the dual travelling wave tube amplifier can be a dual travelling wave tube amplifier notably comprising linear preamplifiers able to implement an RF-mute mode, simultaneously with the activation of said sleep mode.

In an exemplary embodiment of the invention, said Anode Zero driving module can further comprise a regulator whose output is connected to the base of a transistor through a base resistor in a common emitter configuration, and whose emitter is connected to the collector through a first Zener diode setting a minimum cathode current value when said sleep mode is activated, the transistor being then saturated in an Off mode.

In an exemplary embodiment of the invention, said sleep mode can be activated through closing a sleep mode command switch associated with said cathode current setting means, the cathode current setting means being formed by an adjustable voltage.

In an exemplary embodiment of the invention, the power management system can further comprise filtering means allowing slow setting of the voltage reference, with a time constant longer than the reaction time of the regulator.

In an exemplary embodiment of the invention, said filtering means can be formed by a first order filter.

In an exemplary embodiment of the invention, a second Zener diode can be put in series between the transistor collector and a polarization resistor of the Anode Zero, and set a maximum current value.

The present invention proposes to set the cathode current, which represents the current consumption of a TWT, of each TWT independently, to its minimum unregulated level. For the purpose of clarity of the current description, the operating mode of a TWT associated with said minimum unregulated level is referred to as Sleep Mode. Used in conjunction with the RF-Mute mode, the sleep mode allows saving a large amount of current consumption by the TWT whose RF channel is inoperative.

To that end, the current invention proposes to implement the power management system within the EPC, through an adequate electronic circuitry that allows saturating a cathode current control loop, so as to minimize, though not reducing to zero, a TWT consumption when it is not operating, and to manage the proper return on regulation when required.

BRIEF DESCRIPTION OF THE DRAWINGS

These and other characteristics and advantages of the invention will be made clearer in view of the detailed description given below of a preferred embodiment, provided by way of an illustrative and non-limiting example only, as well as the accompanying drawings which represent.

DETAILED DESCRIPTION

Figure 1:
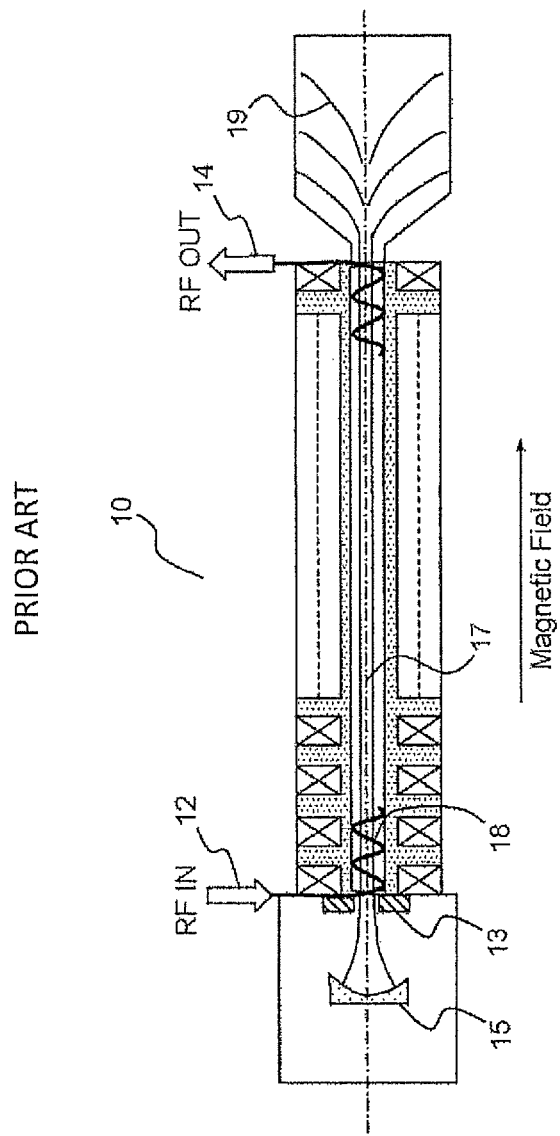
FIG. 1, a perspective view depicting a typical TWT known in the prior art.

FIG. 1 presents a perspective view depicting a typical TWT known in the prior art. A TWT is one of the key elements comprised in a TWTA.

A TWT 10 is basically an elongated vacuum tube comprising a radiofrequency input 12 and a radiofrequency output 14, a cathode 15, forming an electron gun generating an electron beam 17 focused and adjusted by an Anode Zero 13 passing through a helix 18 up to a plurality of collectors 19.

The cathode 15 is heated and emits electrons at one of its ends. A magnetic field is generated substantially around the helix 18 so as to contain the electrons as the focused electron beam 17. The electron beam passes through along the middle axis of the helix 18. The helix 18 is extending from the RF input 12 to the RF output 14. The electron beam 17 is finally striking the collectors 19. The RF signal travels along the helix 18 at a speed that is close to that of the electron beam 17. The amplification effect is due to the interaction between the electromagnetic field induced by the RF signal in the helix 18, and the electron beam 17 through a quantum phenomenon. For the purpose of improving the TWT yield in terms of energy, that is: optimizing recycling of the energy still available at the end of the electron beam 17, a plurality of collectors 19, typically: four or five, may be employed.

A TWTA usually comprises a TWT, associated with an additional Electronic Power Conditioner, hereinafter referred to as EPC, whose purpose is to supply the TWT with requested electrical operational conditions. The EPC is usually a DC-DC converter supplied in energy through a bus, and generating the voltage supply levels requested on each of the electrodes comprised in the TWT, with an accuracy level allowing to ensure the TWT frequency performances, that is: the efficiency and the stability of the power transfer. Particularly, the high voltage between helix 18 and cathode 15 shall be enough accurate, as it is determining the TWT performance. Indeed, as for the helix—cathode voltage: accuracies on the order of 1 Volt are required, for voltages ranking up to several kilovolts; for instance, the required voltages between the helix and the cathode for applications within the Ku band is typically on the order of 6 kilovolts to 7.5 kilovolts. Control of said voltage levels is managed by the EPC.

The electrode referred to as Anode Zero 13 or "Anode 0", allows controlling the electron beam 17 generated by the cathode 15.

Figure 2:
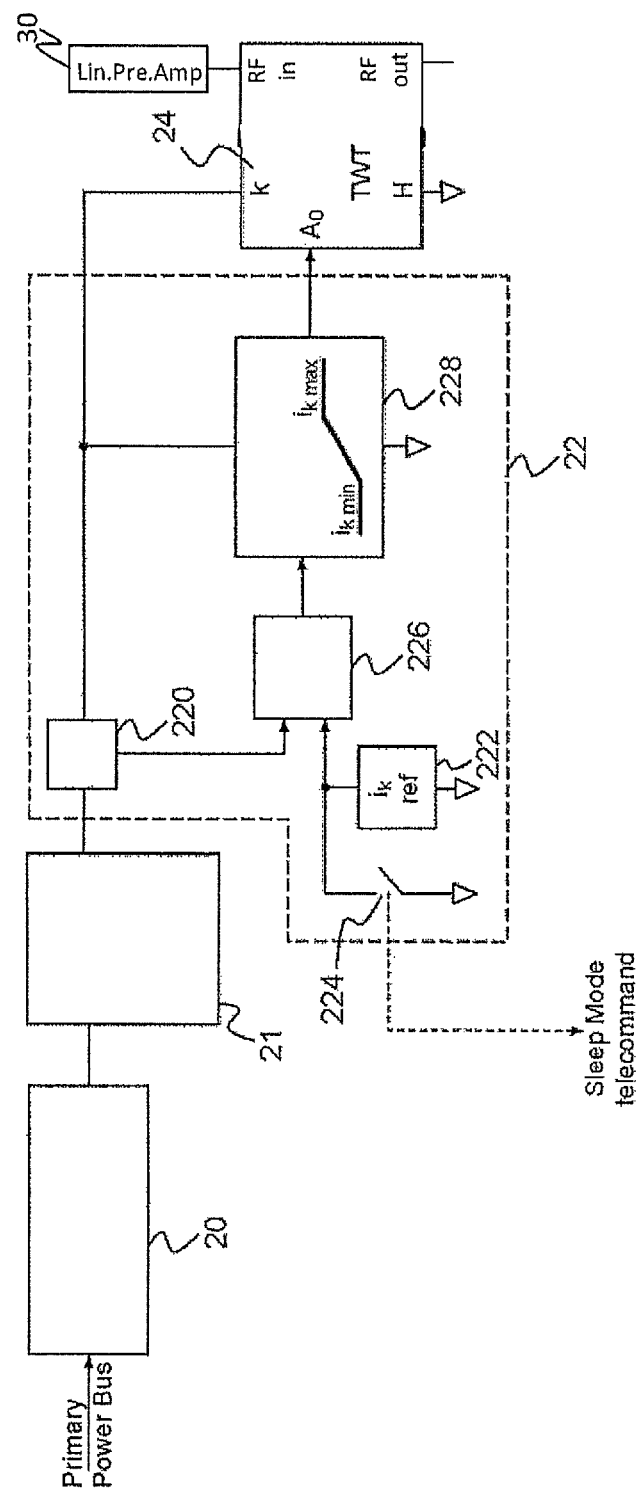
FIG. 2, a functional block diagram depicting a power management system following an exemplary embodiment of the invention.

The power management system, described further into details hereafter in reference to FIGS. 2 et 3, proposes to act on the "Anode 0" of each TWT, through control commands brought by regulation means. A TWT that does not need to be operated, is not completely turned off, but its electron beam is set to its minimum, which, in other words, corresponds to reducing to its minimum the power consumed by the TWT. Each TWT is associated with regulation means. In Sleep Mode, the regulation means of the power management system can regulate the Anode Zero of each TWT in order to saturate the regulation means, hence bring the cathode current to a level very low. The current invention, associated to the RF-mute mode, thus typically allows to reducing by at least 90% the power consumption of an unused TWT which would otherwise uselessly consume power.

It shall be observed that thanks to a power management system following one of the embodiments of the invention described herein, the cathode heating remains nominal and the small cathode current still flowing avoids degradation of the cathode surface. Hence, durability of TWTs driven by the power management system can be preserved.

FIG. 2 presents a functional block diagram depicting a power management system following an exemplary embodiment of the invention.

In a non-limitative example illustrated by the figure, a power management system can be implemented within the EPC of a dual TWTA, and comprises primary power control means 20 driving high-voltage generation means 21, and interfacing through power management means 22, with a TWT 24, both TWT 24 are associated with their own power management means 22, though only one power management means 22 is shown on the figure for the purpose of better clarity.

The primary power control means 20 receive primary power from a primary power bus. The primary control means can for example comprise a power cell ensuring power regulation through two nested loops, one current control loop driven by current sensing means, and by a voltage control loop. The primary power control means 20 then supplies the high-voltage generation means 21. The high-voltage generation means 21 can for example comprise a multistage high voltage transformer. The multistage high voltage transformer can further be associated with rectifiers and filters. The multistage high voltage transformer comprised in the high-voltage generation means 21 allows generating the high voltages requested by a travelling wave tube 24; notably, the multistage high voltage transformer can generate the helix—cathode supply and cathode current can be controlled by the polarization of the Anode Zero 13.

The power management means 22 can comprise a cathode current sensing module 220, a cathode current reference setting module 222, the cathode current sensing module 220 and cathode current reference setting module 222 being driving a cathode current control loop 226. The cathode current sensing module 220 can typically measure a voltage resulting from the cathode current. The cathode current control module 226 and the cathode current sensing module 220 can drive an Anode Zero driving module 228, outputted to the Anode Zero A0 of the TWT 24. A sleep mode command switch 224 can shunt the cathode current reference setting module 222, and is for example driven through adequate messages sent remotely, for example through the satellite onboard communication databus.

Advantageously, the Anode Zero driving module 228 can further comprise delimiting means allowing minimizing and/or maximizing the Anode Zero voltage and consequently the cathode current $i_k$, respectively by setting the cathode current $i_k$ between predetermined minimum $I_{kmin}$ and maximum $i_{kMax}$ values. A more detailed embodiment of the power management means 22 is described hereinafter by referring to FIG. 3.

Figure 3:
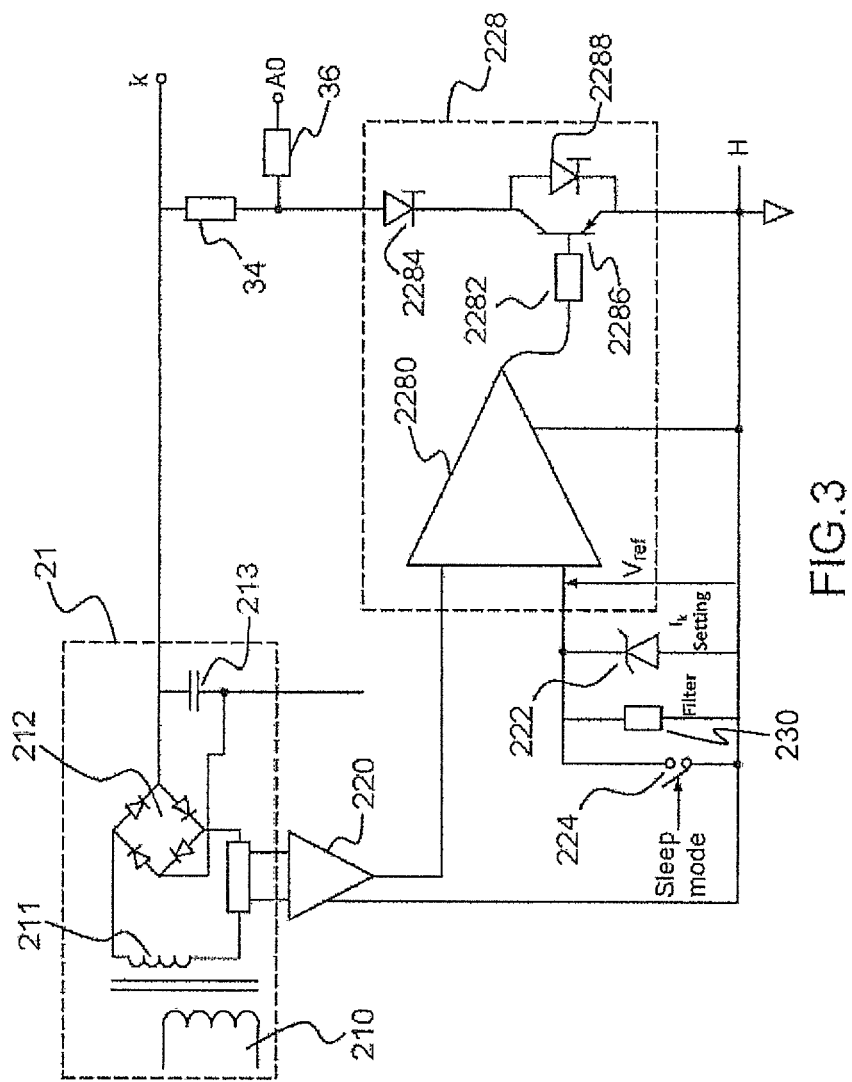
FIG. 3, a simplified electrical diagram depicting a power management system following an exemplary embodiment of the invention.

FIG. 3 presents a simplified electrical diagram depicting a power management system following an exemplary embodiment of the invention.

The high-voltage generation means 21 can comprise at its input a high voltage transformer comprising one primary 210 and one secondary 211. The secondary 211 can be directly routed to a full-wave bridge rectifier circuit for example comprising a diode bridge 212 and a parallel capacitor 213, the bridge rectifier circuit being delivering the cathode current to the cathode K. As illustrated by FIG. 3 as an exemplary embodiment, the Anode Zero driving module 228 can comprise a regulator 2280 whose output is connected to distributing means 2286. The regulator 2280 can for example be a high gain amplifier. For example, the distributing means 2286 can be formed by a transistor in a common emitter configuration, whose base is polarized through a base resistor 2282. The delimiting means referred to above by reference to FIG. 2, can be attached to the distributing means 2286. For example, the delimiting means can be formed by a first Zener diode 2288 put in parallel with the distributing means 2286, that is: between the transistor's collector and emitter in the illustrated example, and a second Zener diode 2284 in series with the transistor's collector, and in series with a polarization resistance 34 of the Anode Zero A0 electrode. A protection resistor 36 can for example be implemented in series with the Anode Zero so as to limit the Anode Zero current, for example in case of defocusing of the TWT. The cathode current reference setting module 222, at an input of the regulator 2280, can for example be formed by an adjustable reference voltage $V_{ref}$ depicted by a Zener diode.

When the sleep mode command is sent, that is: when the sleep mode command switch 224 is closed, then the cathode current reference setting module 222 is shunted, and the regulator 2280 tends to reduce the cathode current to zero, in other words the regulator 2280 is in a low saturation operating point. Thus, the transistor 2286 is saturated and behaves as an open commutator. Therefore, the first Zener diode 2288 fixes the collector-emitter voltage of the transistor 2286, hence the Zener diode 2288 fixes the minimum Anode Zero voltage. The Anode Zero being also determining the cathode current $I_k$, the latter is in this situation set to its minimum value $I_{kmin}$, while its reference setting $I_{ksetting}$ is null, the sleep mode command switch 224 being closed: consequently, the regulator 2280 remains in a low point saturation state, as well as the power management means 22 as a whole can be considered in a low point saturation state. However, even in sleep mode, the cathode current is never actually reduced to a null value, which means that the TWT is maintained in operation at a power below its nominal operating range, and its cathode is maintained at a nominal operating temperature. Hence, it is allowed that the TWT can be made available immediately when need be, without any need for executing initialization and preheating phases, as it would be required in case of a complete cut off of the TWT.

When in normal operation, the power management means 22 is not saturated, and the Anode Zero voltage has an intermediate value corresponding to the requested output level of the TWT 24. Indeed, when the sleep mode command switch 224 is open, the value of the reference voltage $V_{ref}$ in the example illustrated by the figure, determines the voltage value that shall result from the measurement of the cathode current $I_k$ through the cathode current sensing module 220. The regulator 2280 in such a case, operates so as to keep the voltage measured by the cathode current sensing module 220 equal to the reference voltage $V_{ref}$. To that end, the base resistor 2282 is polarized in such a manner that the Anode Zero be polarized with the requested value for the travelling wave tube to provide the requested cathode current $I_k$, the power management means 22 then acts as a regulation loop.

The second Zener diode 2284 can be used in an advantageous embodiment, and allows setting the maximum Anode Zero voltage A0, as well as maximum cathode current value $I_{kMax}$. It shall be observed that in normal operation, the transistor 2286 is not saturated, so as to maintain the regulation loop formed by the power management means 22. The operating limits are therefore determined by the commutation of the transistor 2286, either saturated in Off mode during sleep mode, or in On mode, this latter mode being determining the maximum value $I_{kMax}$ of the cathode current.

It shall also be observed that when exiting from the Sleep mode, it shall be particularly advantageous to properly control the variations of the cathode current reference setting for example through $V_{ref}$ setting, so as to prevent the regulator from retrieving its optimum operating point after high amplitude oscillations that would be likely to damage the tube. Advantageously, filtering means (230) can be proposed, so as to allow the voltage reference $V_{ref}$ to slowly get to an operational value, that is: more slowly than the reaction time of the regulator 2280, so that the regulator 2280 may properly follow the reference setting, and properly stabilize to the requested value, with no undesirable overtaking nor oscillations. For example, a first order filter may be used, with a time constant much higher than the reaction time of the regulator 2280.

Advantageously, in parallel with the sleep mode command, the RF-mute mode can be activated, through a command that can be sent to the RF signal linearized preamplifier (30), aiming at cutting off the RF signal, this command being usually referred to as a "blanking" command.

The invention claimed is:

1. A power management system for a dual travelling wave tube amplifier, comprising:
   two travelling wave tubes, each comprising one Anode Zero electrode, and
   an electronic power conditioner,
   the power management system being implemented in said electronic power conditioner and comprising power management means associated with each travelling wave tube, configured for setting the Anode Zero electrode voltage to a determined minimum value when a sleep mode is activated, the power management means maintaining the travelling wave tube operating power at a value below its nominal working range.

2. A power management system according to claim 1, further comprising a cathode current control loop driven by a cathode current setting means and a cathode current sensing means, the cathode current control loop driving an Anode Zero driving module setting the Anode Zero voltage.

3. A power management system according to claim 1, wherein the dual travelling wave tube amplifier comprises linear preamplifiers able to implement an RF-mute mode, simultaneously with the activation of said sleep mode.

4. A power management system according to claim 2, wherein said Anode Zero driving module further comprises a regulator whose output is connected to the base of a transistor through a base resistor in a common emitter configuration, and whose emitter is connected to the collector through a first Zener diode setting a minimum cathode current value when said sleep mode is activated, the transistor being then saturated in an Off mode.

5. A power management system according to claim 2, wherein said sleep mode is activated through closing a sleep mode command switch associated with said cathode current setting means, the cathode current setting means being formed by an adjustable voltage $V_{ref}$.

6. A power management system according to claim 5, further comprising filtering means allowing slow setting of the voltage reference $V_{ref}$, with a time constant longer than the reaction time of the regulator.

7. A power management system according to claim 6, wherein said filtering means is formed by a first order filter.

8. A power management system according to claim 4, wherein a second Zener diode in series between the transistor collector and a polarization resistor of the Anode Zero sets a maximum current value.

* * * * *